(12) United States Patent
Van Lammeren et al.

(10) Patent No.: US 6,788,089 B2
(45) Date of Patent: Sep. 7, 2004

(54) METHOD AND APPARATUS FOR INSPECTING AND INTEGRATED CIRCUIT BY MEASURING VOLTAGE ON A SIGNAL LINE

(75) Inventors: Johannes P. M. Van Lammeren, Nijmegen (NL); Taco Zwemstra, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 8 days.

(21) Appl. No.: 09/819,287

(22) Filed: Mar. 28, 2001

(65) Prior Publication Data

US 2001/0013791 A1 Aug. 16, 2001

Related U.S. Application Data

(63) Continuation of application No. 08/859,592, filed on May 20, 1997, now Pat. No. 6,239,604.

(30) Foreign Application Priority Data

Oct. 4, 1996 (EP) ............................................ 96202778

(51) Int. Cl.$^7$ ............................................. G01R 31/02
(52) U.S. Cl. ....................................................... 324/765
(58) Field of Search .................. 324/73–158, 750–769, 324/715–719, 500–537, 126–127, 158.1, 73.1, 550; 438/14–18

(56) References Cited

U.S. PATENT DOCUMENTS

| | | | | |
|---|---|---|---|---|
| 3,974,443 A | * | 8/1976 | Thomas ....................... 324/716 |
| 4,584,525 A | * | 4/1986 | Harnden et al. ............. 324/126 |
| 4,725,773 A | * | 2/1988 | Lieneweg ................... 324/73.1 |
| 4,739,258 A | * | 4/1988 | Schwarz ...................... 324/537 |
| 4,835,466 A | * | 5/1989 | Maly et al. .................. 324/537 |
| 4,918,377 A | * | 4/1990 | Buehler et al. ............. 324/716 |
| 5,162,742 A | * | 11/1992 | Atkins et al. ............... 324/537 |
| 5,483,173 A | * | 1/1996 | Pellegrini ................... 324/765 |
| 5,489,851 A | * | 2/1996 | Heumann et al. ........... 324/537 |
| 5,804,979 A | * | 9/1998 | Lund et al. ................. 324/713 |
| 6,239,604 B1 | * | 5/2001 | Van Lammeren et al. .. 324/765 |

* cited by examiner

*Primary Examiner*—Vinh P. Nguyen
(74) *Attorney, Agent, or Firm*—Michael J. Ure

(57) ABSTRACT

The method for inspecting an integrated circuit comprising a plurality of sub-circuits includes the determination of the supply current into at least one of the sub-circuits. This supply current is determined, while the other sub-circuits are operational, by measuring the voltage over a segment of the supply line through which this supply current flows. This supply line contains no additional components to facilitate the measuring of the voltage.

Figure 1:
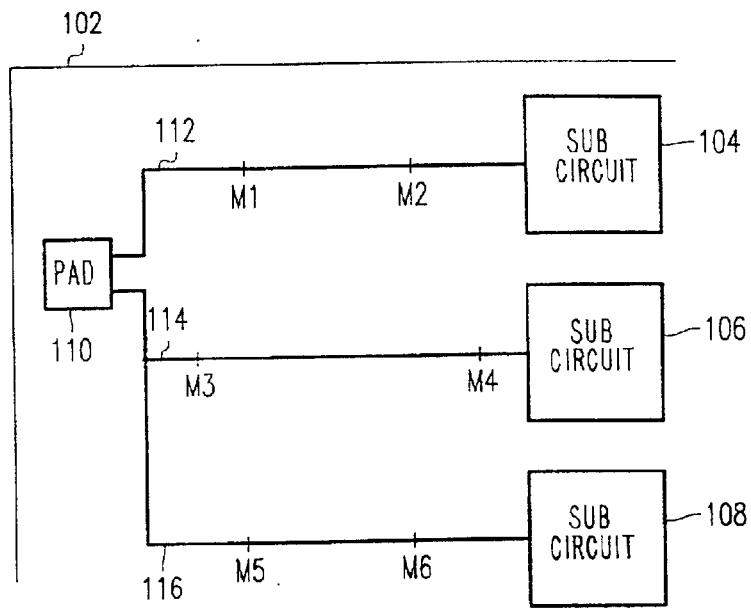

6 Claims, 4 Drawing Sheets

METHOD AND APPARATUS FOR INSPECTING AND INTEGRATED CIRCUIT BY MEASURING VOLTAGE ON A SIGNAL LINE

CROSS REFERENCE TO RELATED APPLICATIONS

This is a continuation of application Ser. No. 08/859,592, filed May 20, 1997, now U.S. Pat. No. 6,239,604.

The invention relates to a method for inspecting an integrated circuit, the circuit comprising a plurality of sub-circuits and the method comprising a determination of a first supply current in a supply line of a first sub-circuit of the sub-circuits.

The invention further relates to an integrated circuit comprising a plurality of sub-circuits and comprising a current-measuring device for measuring a supply current in a supply line of at least one of the sub-circuits.

Such method and circuit are known from the Japanese Patent Application published under JP-A 62-278473. The known circuit comprises a number of sub-circuits and a current-detection circuit. Each sub-circuit has in its supply line a controllable switch which can connect the sub-circuit to the current-detection circuit in order to supply power to the sub-circuit. At a certain moment, one or more of the sub-circuits are connected to the current-detection circuit and the current-detection circuit measures the current to those connected sub-circuits. The not-connected sub-circuits do not receive power and are therefore not operational. The known circuit has a drawback in that the controllable switch in the supply line of the sub-circuit influences the behaviour of the sub-circuit even when such switch is closed. Depending on the implementation, the switch causes a voltage drop in the supply line and adversely affects the dynamic behaviour of the sub-circuit. In practice it is desirable to measure the current flowing into one sub-circuit at a time, because this will give the most accurate measurement of the current. The known circuit then has a disadvantage in that only the sub-circuit connected to the current-detection unit is operational and that the other sub-circuits remain in-operational. In the case that the sub-circuits are tightly coupled, as for example in a complex analogue integrated circuit, an in-operational sub-circuit may have an unpredictable influence on the current consumption in another, operational sub-circuit and may even damage a sub-circuit.

It is an object of the invention to provide a method of the kind set forth which influences the circuit to a lesser degree and which is better usable than the known method. This object is achieved according to the invention in a method that is characterised in that a first voltage over a segment of the supply line is measured, while all sub-circuits are operational, and that the determination of the first supply current is carried out on the basis of the first voltage and the resistance of the segment of the supply line. The method according to the invention has the advantage that no additional components are introduced in the supply line of the sub-circuit. The method uses the effect that a voltage drop occurs in the supply line itself due to the inherently present resistance of the supply line. After measuring the voltage drop over a given segment of the supply line, the supply current can be calculated based on the value of the resistance of the supply line. A further advantage of the method according to the invention is that a sub-circuits remains operational, even in the situation where its supply current is not determined. This means that possible interactions between sub-circuits all remain as in the normal operational mode and that no unpredictable currents will flow.

An embodiment of the method according to the invention, comprising a determination of a second supply current in a supply line of a second sub-circuit of the sub-circuits, is characterised in that a second voltage is measured over a segment of the supply line of the second-sub-circuit and that the first and the second voltage are measured by successively connecting a single voltage-measuring device to the segments of the first supply line and the second supply line respectively. A single voltage-measuring device now suffices for measuring the voltages over the various segments of the supply lines of the sub-circuits, instead of a voltage-measuring device for each individual segment.

An embodiment of the method according to the invention is characterised in that at least one of the voltages is measured by a differential pair of transistors. The topology of circuits in practice and the process for producing them are such that a differential pair of transistors can be employed for a range of voltage values to be measured. The differential pair of transistors is a very simple device of only two transistors and thus requires very few additional components to the circuit. Furthermore the input impedance of the differential pair is very high compared to the sub-circuit fed by the supply line and there will be no noticeable influence on the supply line by the differential pair.

An embodiment of the method according to the invention is characterised in that the at least one of the voltages is measured in the following steps:

connecting a first input of the differential pair of transistors to a first side of the particular segment, connecting a second input of the differential pair of transistors to a second side of the particular segment and making a first measurement, connecting the first input of the differential pair of transistors to the second side of the particular segment, connecting the second input of the differential pair of transistors to the first side of the particular segment and making a second measurement, combining the first measurement and the second measurement to a result for use as the measured voltage over the particular segment.

In this embodiment, the accuracy of a DC-measurement is increased by making the two measurements with interchanged connections to the particular segment, thereby eliminating the offset of the differential pair of transistors. This offset is present in both measurements and can be eliminated by combining the two measurements.

An embodiment of the method according to the invention is characterised in that the supply current is compared with a for that particular supply current determined range and that the circuit is rejected if the supply current falls outside the range. By comparing the measured supply current with a standard, to be expected value, faults in the circuit can be detected and if present the circuit can be rejected. Faults in a circuit may lead to a deviation of the supply current from the supply current in a completely correct circuit. By accurately measuring the supply current, the existence of such a fault in the circuit can be determined. The accuracy of such a test can be increased by subdividing the circuit into a number of sub-circuits each having fewer components than the original circuit. Then the deviation due to the fault can be better distinguished compared with the situation of a large circuit with many components. This method according to the invention can be used for testing the correctness of integrated circuits in various stages of the production process, e.g. as a test on a wafer with integrated circuits, but also for various tests on the finished product, e.g. a reliability test during the operational life of an integrated circuit.

An embodiment of the method according to the invention, comprising the determination of at least two supply currents for respective sub-circuits, is characterised in that a current ratio is determined between a first one and a second one of the two supply currents and that the integrated circuit is rejected if the current ratio falls outside a for the particular current ratio determined range. The production process of the integrated circuit will influence both supply currents in a similar way, e.g. a certain increase of the current. By comparing the ratio between the two currents of the same circuit with some standard value rather than comparing the absolute value of the current with a standard value, the influence of the production process on a test of the circuit is reduced.

It is a further object of the invention to provide a method for inspecting an integrated circuit, the method comprising a determination of a current in a signal line in the circuit, characterised in that a voltage over a segment of the signal line is measured and that the determination of the current is carried out on the basis of the voltage and the resistance of the segment of the signal line. The method according to the invention as described above for determining the supply current in one or more supply lines exploits the fact that a supply line inherently has a parasitic resistance. Now a signal line in a circuit also has an inherently present parasitic resistance. Therefore a current in such a signal line can be determined in a similar manner as the current in the supply line. In the method according to the invention, the signal current is determined in a non-invasive way, without the addition of components or the like in the signal line that might influence the behaviour of the circuit. The voltage over the segment of the signal line can be measured without causing noticeable influence on the circuit. These advantages are particularly important for signal lines that are sensitive to external disturbances.

It is a further object of the invention to provide an integrated circuit of the kind set forth in which a supply current in a sub-circuit can be measured in an improved way compared with the known integrated circuit. This object is achieved according to the invention in an integrated circuit that is characterised in that the current-measuring device comprises a voltage-measuring device for measuring a voltage over a segment of the supply line. In this circuit, the supply current in a supply line can be measured without any additional components in the supply line. Such additional components could influence the operational behaviour of the sub-circuit. The measurement of the voltage drop over a segment of the supply line and the resistance of this segment make it possible to determine the current through the supply line. Furthermore, the integrated circuit according to the invention has the advantage that a sub-circuit remains operational, also during the period where no measurement of the current for the particular sub-circuit is made.

An embodiment of the integrated circuit according to the invention is characterised in that the current-measuring device comprises connection means for successively connecting the voltage-measuring device to the segment of the supply line and to a segment of a supply line of a further one of the sub-circuits. The advantage of such a circuit is that a single voltage-measuring device suffices to make measurements over various segments of supply lines of various sub-circuits. This reduces the number of additional components necessary for the measurements.

An embodiment of the integrated circuit according to the invention, which circuit comprises a detection and/or diagnostic sub-circuit, is characterised in that the detection and/or diagnostic sub-circuit is arranged to process the result of the current-measuring device and to feed a result of the processing outside the circuit. By processing the result of the current-measuring device in the detection and/or diagnostic sub-circuit of the integrated circuit, an assessment of the circuit's operation can be made internally, without the need of external equipment. Such an assessment can relate to an operational test to verify whether the circuit operates within specification limits. Furthermore, by regularly performing such an assessment the degradation of the circuit over time can be determined and the expected life time of the circuit can be estimated. Particularly in safety-critical applications such an assessment is valuable in order to determine the moment for replacement of the circuit. The result of the detection and/or diagnostic sub-circuit can be output in various ways, depending on the kind of assessment made. Examples are an output in the form of a simple pass/fail indication on a terminal of the circuit, and an output in the form of a signature of one or more words of several bits comprising a further qualification of the result. Such words can be serially output via a terminal of the circuit.

An embodiment of the circuit according to the invention is characterised in that the voltage-measuring device comprises a differential pair of transistors. The differential pair of transistors has a high impedance and therefore has a negligible influence on the supply line compared to the sub-circuit fed by the supply line. Because the differential pair requires two transistors, only few additional components are required to realise this voltage-measuring device.

It is a further object of the invention to provide an integrated circuit comprising a current-measuring device for measuring a current in a signal line in the circuit, characterised in that the current-measuring device comprises a voltage-measuring device for measuring a voltage over a segment of the signal line. Exploiting the fact the signal line has an inherently present resistance which causes a voltage drop over a segment of the signal line, is an advantageous method for determining the current in such a signal line. The method according to the invention is non-invasive and has a negligible influence on the behaviour of the circuit.

Figure 2:
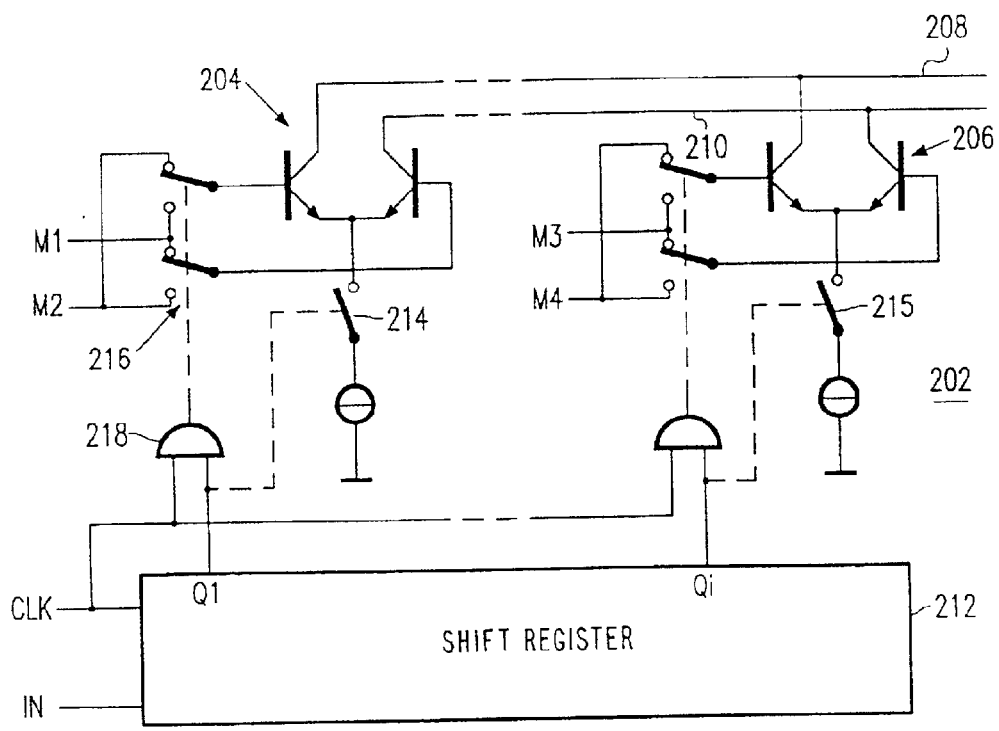
Figure 3:
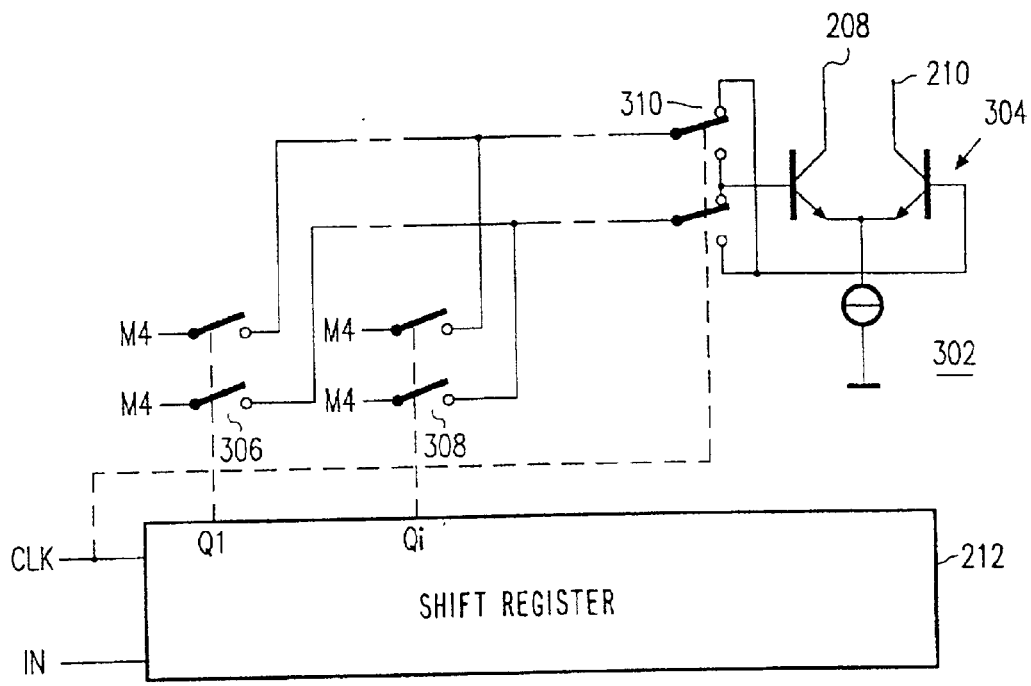
Figure 5:
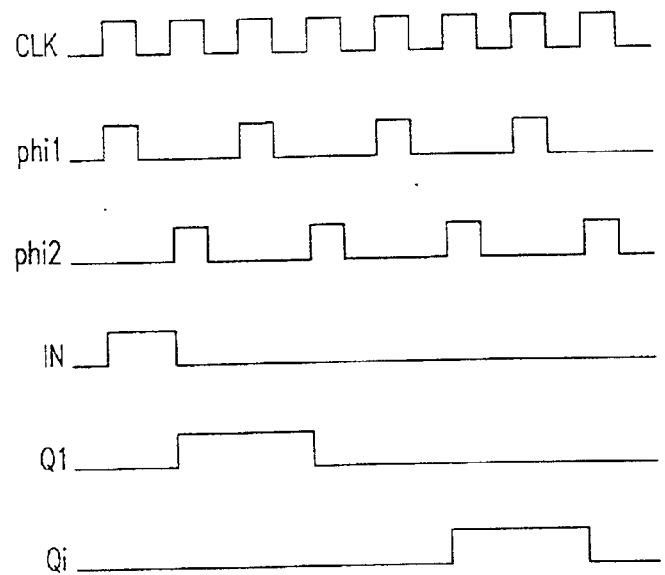
Figure 4:
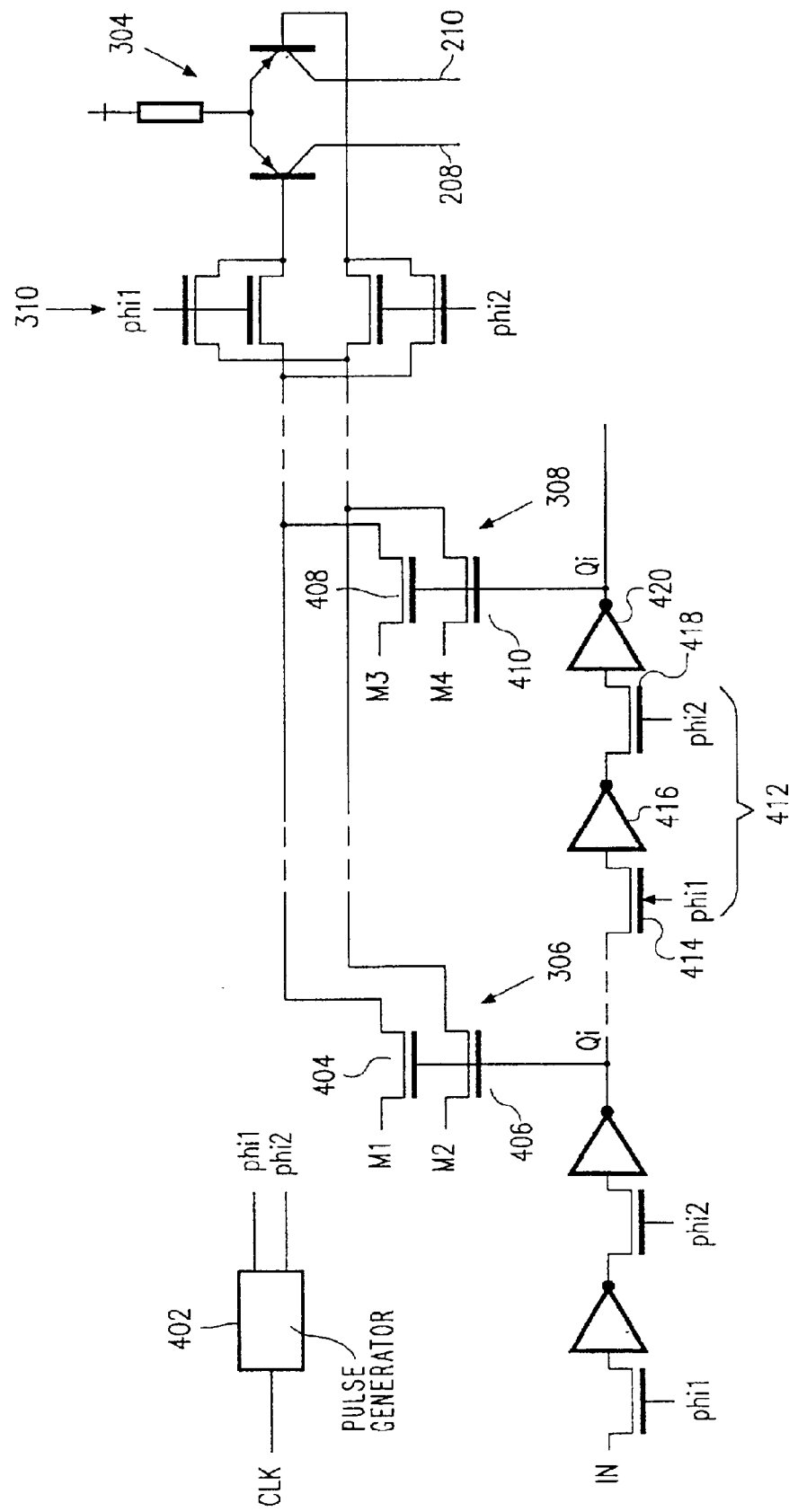
Figure 6:
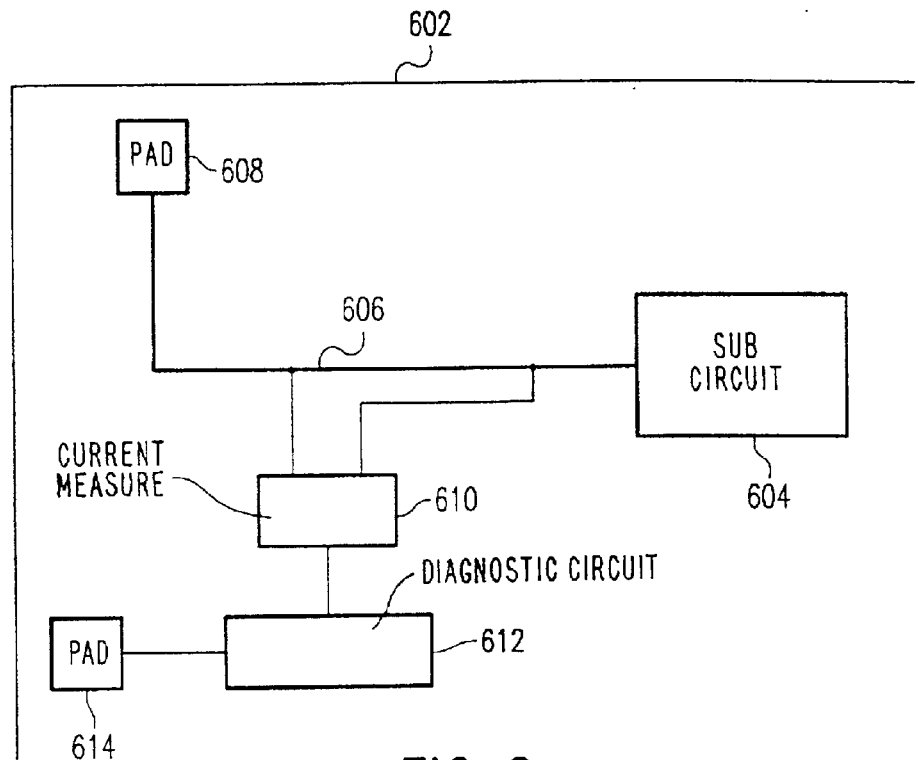
Figure 7:
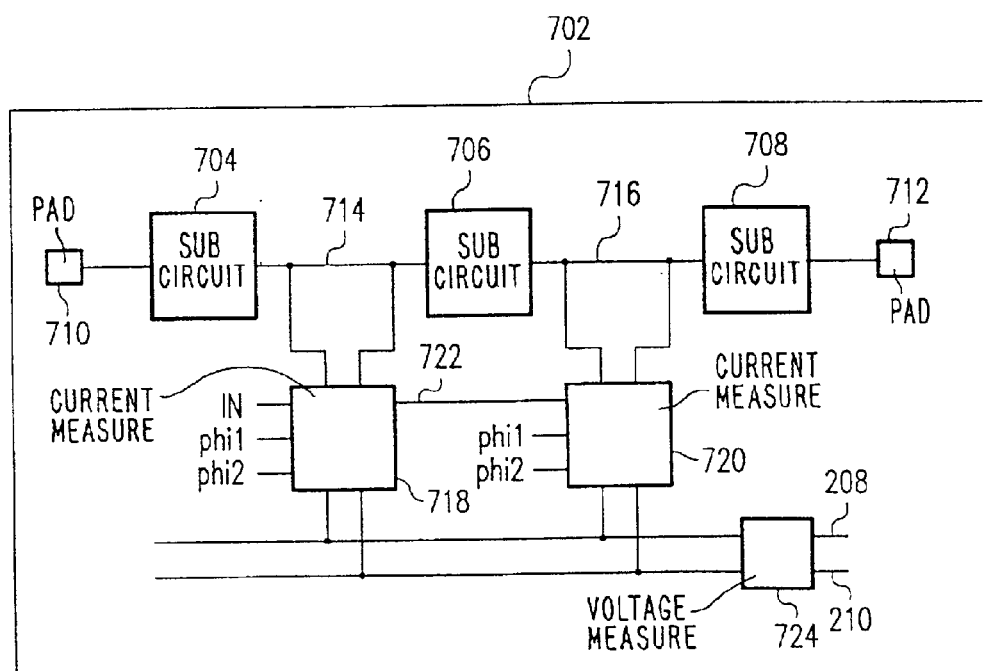

The invention and its attendant advantages will be further elucidated with the aid of exemplary embodiments and the accompanying schematic drawings, whereby:

FIG. 1 schematically shows an application of the invention,

FIG. 2 schematically shows a current-measuring device according to the invention, FIG. 3 schematically shows an alternative current-measuring device according to the invention, FIG. 4 shows an implementation of the alternative current-measuring device according to the invention, FIG. 5 shows the timing diagram of the signals controlling the current-measuring device according to the invention, FIG. 6 shows some elements of an integrated circuit according to the invention, and FIG. 7 schematically shows an application of the invention for signal currents.

Corresponding features in the various Figures are denoted by the same reference symbols.

FIG. 1 schematically shows an application of the invention. In this application, the supply current of an integrated circuit is to be measured in order to verify the quality of the circuit. A supply current that deviates to a certain degree from the expected value indicates a fault in the circuit and such a circuit is then rejected. If for this purpose the supply current to the whole circuit would be measured, then the existence of a fault might not be detected. The variation of the supply current caused by the fault is then very small compared with the total supply current. If the circuit comprises a number of smaller sub-circuits and the supply current to such a sub-circuit is measured, then the relative variation in the supply current to the sub-circuit due to a fault will be larger and can more reliably be detected. The division of a circuit into sub-circuits might have been done already in view of the design of the circuit, e.g. the required function of a circuit is partitioned into a number of sub-functions that are subsequently designed as sub-circuits. However, the circuit may also be divided or further divided in view of the test comprising the measurement of the current in the sub-circuits. A circuit in which the invention has been successfully applied was divided into 24 sub-circuits. Each individual sub-circuit had an average supply current of 4.6 mA. An integrated circuit 102 comprises a number of sub-circuits, symbolised by blocks 104, 106 and 108. The blocks receive their supply current from a pad 110, via supply lines 112, 114 and 116 respectively. The supply current to a sub-circuit is determined by measuring the voltage drop over a segment of the particular supply line. The supply line has a certain internal resistance and a current flowing through the supply line will cause a voltage drop. Supply line 112 has measuring points M1 and M2 and a voltage is measured between those two points. The current through supply line 112 can be calculated based on this voltage and the resistance of the segment between M1 and M2. Similarly, supply line 114 has measuring points M3 and M4 and supply line 116 has measuring points M5 and M6.

Determining the supply currents according to this method has the advantage that all sub-circuits can remain in their normal operational mode. When for instance the supply current to sub-circuit 104 is determined, by measuring the voltage between M1 and M2, sub-circuits 106 and 108 receive their supply currents in the normal way and will remain operational. This is particularly advantageous for an integrated circuit with sub-circuits that are tightly coupled. If in such a circuit, the supply current measurement of for instance sub-circuit 104 would require sub-circuits 106 and 108 to be switched off, then that measurement would be heavily influenced by unpredictable currents. These unpredictable currents occur because the sub-circuits 106 and 108 are switched off and sub-circuit 104 is tightly coupled to them. Furthermore, even damage could occur in such a circuit when arbitrary sub-circuits are switched operational while others are switched in-operational. A further advantage of this method of current measuring is that the sub-circuits nor their supply lines have to be modified to make the measurement possible. This is because the method uses the presence of the resistance of the supply line and the related voltage drop over a segment of the supply line, without any additional components or switches in the supply line. To optimise the measurement accuracy, small modifications to the circuit can be applied, e.g. introduce a branch in a supply line or re-route part of a supply line. Furthermore, the voltage can be measured with a device that does not cause any noticeable influence on the supply line. This is realised by a voltage-measuring device with a very high impedance compared with the sub-circuit fed by the supply line.

In order to receive power, a circuit, and also a sub-circuit, is connected with one side to a power supply and with the other side to the ground. The line connecting the circuit to the power supply line is then called the supply line, and can be seen as a 'true' supply line, and the line connecting the circuit to the ground is called the ground line. The invention can be used for determining the current in the 'true' supply line as well as for determining the current in the ground line. So in the context of this invention the term 'supply line' is understood to include a true supply line as well as a ground line.

The term 'integrated circuit' used throughout this document is understood to include not only 'traditional' ICs, with an electronic circuit on a semiconductor substrate, but also devices comprising compositions of these substrates, such as Multi Chip Modules, and devices based on other technologies like Silicon On Insulator. Essential for the type of circuit to which the invention can be applied is that the lines in the circuit carrying a current, have an inherent, parasitic resistance causing a voltage drop that can be used for measuring that current. Furthermore, the invention can be applied to an electronic circuit regardless the specific type of that electronic circuit. It can be used for analogue circuits as well as for digital circuits and mixed signal circuits.

FIG. 2 schematically shows a current-measuring device according to the invention. The current-measuring device 202 can measure the current in the supply line of the sub-circuits shown in FIG. 1. This is explicitly shown for supply line 112 with measuring points M1 and M2 and for supply line 114 with measuring points M3 and M4. The voltages over the pairs of measuring points are measured with voltage-measuring devices 204 and 206 respectively. The voltage-measuring device is in FIG. 2 shown as a differential pair of transistors. This is a particular realisation of the voltage-measuring device and many other realisations are possible. The output of the voltage-measuring device is transferred via lines 208 and 210 for further processing. This can take place internally in the circuit but the output can also be transferred to test pads in order to be processed externally, e.g. by some test equipment. A shift register 212 controls the activation of the voltage-measuring devices through logical signals activating respective switches. The signal Q1 selects the particular voltage-measuring device 204 through activation of switch 214. The shift register 212 is arranged to shift the signal IN through the register, under control of the clock signal CLK, which causes the successive signals Qi to become high. This causes the activation of the successive switches 214–215 and, through that, of the successive voltage-measuring devices 204–206. Now in the embodiment with the differential pair of transistor as voltage-measuring device, a toggle switch 216 is present which causes the voltage-measuring device to take two measurements, whereby the connection to the measuring points M1 and M2 is reversed between the two measurement. Toggle switch 216 is controlled by a signal generated by and-gate 218 from the signal CLK and Q1. Transistors of a differential pair have a small mutual difference which causes an offset in a voltage measurement. Now to improve the DC-measurement with such a differential pair, two measurements are taken, as described above, with reversed connection to the measuring points. The offset is present in both measurements and by combining these two measurements into one result for use as the resulting voltage measurement, the offset is eliminated. The combining can be realised as calculating the average of the absolute values of the two measurements. The toggle switch is an optional element used for improving the accuracy of the DC-measurement with a differential pair of transistors. If the improved accuracy is not necessary or if AC-measurements are taken, the toggle switch can be dispensed with. Also if the voltage-measuring device is realised in another way than through a differential pair of transistors, the toggle switch may not be required.

FIG. 3 schematically shows an alternative current-measuring device according to the invention. The current-measuring device 302 has a single voltage-measuring device 304 that can be connected to the measuring points M1 and M2 or M3 and M4 under control of the shift register 212. The signal IN passes through the shift register, causing successive signals Qi to become high and thereby activating successive switches 306–308. These switches connect the voltage-measuring device 304 to the respective measuring points. Furthermore there is an optional toggle switch 310 which causes the voltage-measuring device to take two measurements, with reversed connection, of each of the pair of measuring points. The toggle switch is now under control of the clock signal CLK. The advantage of this current-measuring device is that only one voltage-measuring device is necessary, for making the measurements at a potentially large number of points. Then fewer components are necessary in the current-measuring device. In a circuit in which the invention was applied, the voltage of 24 pairs of measuring points was measured.

FIG. 4 shows an implementation of the alternative current-measuring device according to the invention. Element 402 generates clock pulses phi1 and phi2 from the clock signal CLK as shown in FIG. 5. In FIG. 4, the lines distributing those pulses are not shown for reasons of clarity and the respective connections are symbolised through the names of the pulses. The switch 306 is implemented by transistors 404 and 406 and switch 308 by transistors 408 and 410. The shift register comprises various sections, like section 412, each generating a particular switching signal Qi. Such a section contains a serial connection of a transistors 414, under control of clock pulse phi1, a buffer 416, a transistor 418 under control of phi2, and a buffer 420. The signal IN is shifted through a section of the shift register in two cycles of the clock signal CLK, as can be seen from the timing diagram in FIG. 5. The signals Q (Q1–Qi) successively receive the signal pulse IN and activate the particular transistors (404 and 406 to 408 and 410) which connect the voltage-measuring device 304 to the particular measuring points (M1 and M2 to M3 and M4). The optional toggle switch 310 is implemented by 4 transistors connecting the voltage-measuring device under control of phi1 and phi2 in the two different, opposite ways to the measuring points.

FIG. 5 shows the timing diagram of the signals controlling the current-measuring device according to the invention. This figure shows the time dependent behaviour of the signals used in the current-measuring device shown in FIG. 4. The signal IN is shifted through the shift register and makes the successive signals Q high. When signal Q1 is high, switch 306 is activated and the voltage measuring device 304 is connected to measuring points M1 and M2. When signal Qi is high, switch 308 is activated and the voltage measuring device 304 is connected to measuring points M3 and M4.

FIG. 6 shows some elements of an integrated circuit according to the invention. The integrated circuit 602 comprises a sub-circuit 604 with a supply line 606 which is connected to pad 608. The supply current in the supply line 606 can be determined with a current-measuring device 610 according to the invention. The integrated circuit further comprises a detection and/or diagnostic sub-circuit 612, which controls the current-measuring device 610 and which can receive data from it. The detection and/or diagnostic sub-circuit and the current-measuring device can be arranged to measure the current in supply lines of many other sub-circuits of the integrated circuit. Through such a detection and/or diagnostic sub-circuit various tests can be implemented. It is possible to implement a so-called Built-In Self-Test (BIST), which can be started by an outside signal transferred to the detection and/or diagnostic sub-circuit via pad 614. The result of the self-test can be output via the same pad 614. Furthermore it is possible to implement a test that verifies the reliability of the integrated circuit. Regular measurements can show the level of degradation of the integrated circuit and for safety-critical application can indicate the need to replace the circuit at a certain moment. An example of such degradation is the so-called electron migration affecting the supply line and causing an increase of the resistance of the supply line.

The method according to the invention can be used to test the correctness of the integrated circuit. A supply current to a sub-circuit that deviates from the expected value indicates a fault in that sub-circuit. After establishing such a fault in a test, the integrated circuit will be rejected. The method can be used in testing the IDDQ current, where a certain class of defects give rise to such a current that can be measured with the method according to the invention. The actual supply current to a sub-circuit is governed by certain parameters of the sub-circuit which are dependent on the production process of the integrated circuit, e.g. the resistance of the various lines in the sub-circuit. This means that the supply current to a particular sub-circuit of a certain integrated circuit may be different from the supply current to the corresponding sub-circuit of a similar integrated circuit produced in a different batch, while both sub-circuits are correct. This may be even true for integrated circuits on the same wafer. So when comparing the supply current of a sub-circuit with a standard, to be expected value, one has to allow a margin in the measured current before rejecting the integrated circuit in order to avoid rejection of a correct circuit. An alternative to comparing the absolute value of the supply current of a sub-circuit with a standard value, is comparing the ratio of the supply currents to two sub-circuits of the same integrated circuit with a standard value. If one of the sub-circuits has a fault causing a change in the supply current, than the measured ratio will deviate from the expected ratio and because of this the integrated circuit can be rejected. The advantage is that the ratio of two supply currents is less dependent on the production process of the integrated circuit than an individual supply current. Both supply currents will be influenced by the process in a similar way causing a comparable change in both currents. By dividing one current through the other, one change cancels the other change to a large degree and the net change on the ratio is small.

A further application of the method according to the invention is a test to the presence and correct connection of bond wires in an integrated circuit. Such a test is performed on the integrated circuit after it has been mounted in a package. Application of the method is particularly advantageous if the circuit has several supply pads, which are to be connected with bond wires to a single supply terminal of the package. According to the method, the current in each of the lines connected to a respective supply pad can be determined. A fault in the connection of a particular bond wire will be detected, since it will be determined that there is no current in the corresponding supply line.

The method according to the invention can be used to measure a direct current (DC) flowing through a line of the integrated circuit. The method can also be used to measure an alternating current (AC) through a line by repeatedly measuring the voltage over the segment of the particular line. In this way also transient responses in the supply current can be measured.

FIG. 7 schematically shows an application of the invention for signal currents. The integrated circuit 702 comprises sub-circuits 704, 706 and 708. The integrated circuit receives an input signal on pad 710 and outputs the result via pad 712. The input signal is first processed by sub-circuit 704, which supplies its result via signal line 714 to the sub-circuit 706. This sub-circuit 706 processes this result and supplies its own result via signal line 716 to the sub-circuit 708. In order to determine the currents in the signal lines 714 and 716, the circuit is provided with a current-measuring device as described above. Two measuring points in the signal line 714 are connected with measuring unit 718. This unit comprises a section of the shift register and the corresponding transistor switches as described in FIG. 4, e.g. section 412 and transistors 408 and 410. Similarly, two measuring points of the supply line 716 are connected to a measuring unit 720. The units 718 and 720 are connected to each other with line 722, for carrying the signal IN to successively activate the units. The units 718 and 720 are connected to a voltage-measuring device 724, like device 304, which optionally comprises a toggle switch like switch 310. The current in the signal line is determined by measuring the voltage drop between the measuring points. This voltage drop is caused by the internal, parasitic resistance of the signal line. The invention offers a flexible way to measure signal currents at various places in the integrated circuit, requiring only a small overhead of a few additional components and a few additional lines. The invention requires no additional components in the signal line and causes only a small influence on the signal line.

What is claimed is:

1. A method for inspecting an integrated circuit, the method comprising:

measuring a voltage over a segment of a signal line; and determining a signal current flowing through the signal line on the basis of the voltage and the resistance of the segment of the signal line, wherein inspection of the integrated circuit is performed on the basis of the determined signal current.

2. An integrated circuit comprising:

a signal line; and a current measuring device for determining a current in the signal line, wherein the current measuring device comprises a voltage measuring device connected across a segment of the signal line, said voltage measuring device being adapted to measure a voltage over a segment of the signal line, and wherein the current measuring device determines the current on the basis of the measured voltage and an inherent resistance of the segment.

3. The method of claim 1, wherein measuring the voltage comprises:

connecting first and second inputs of a differential pair of transistors to first and second sides, respectively, of the segment, and making a first measurement;

reversing the connection of the differential pair of transistors to the segment by connecting the first and second inputs of the differential pair of transistors to the second and first sides of the segment, respectively, and making a second measurement; and combining the first and second measurements to derive a result for use as the measured voltage over the segment.

4. The integrated circuit of claim 2, wherein the voltage measurement device includes:

a differential pair of transistors having respective first and second inputs; and means for toggling connections between first and second sides of the segment and the first and second inputs of the differential pair of transistors.

5. The integrated circuit of claim 2, further comprising means for successively connecting the voltage measuring device to the segment of the signal line and to a segment of a second signal line of the integrated circuit.

6. The integrated circuit of claim 2, further comprising first and second sub-circuits, and wherein the signal line extends between the first and second sub-circuits.

* * * * *